United States Patent
Parodi

(10) Patent No.: US 10,302,699 B1
(45) Date of Patent: May 28, 2019

(54) PRECISE TRANSMISSION MEDIUM DELAY MEASUREMENT

(71) Applicant: Amazon Technologies, Inc., Seattle, WA (US)

(72) Inventor: Carlos Guillermo Parodi, Issaquah, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/907,048

(22) Filed: Feb. 27, 2018

(51) Int. Cl.
| | |
|---|---|
| G06F 7/58 | (2006.01) |
| H03L 7/06 | (2006.01) |
| G01R 31/3183 | (2006.01) |
| H01L 29/24 | (2006.01) |

(52) U.S. Cl.
CPC ........... G01R 31/318328 (2013.01); G01R 31/318385 (2013.01); G06F 7/584 (2013.01); H03L 7/06 (2013.01); G06F 2207/581 (2013.01); H01L 29/24 (2013.01)

(58) Field of Classification Search
USPC ......................................... 327/156, 158, 160
See application file for complete search history.

(56) References Cited

U.S. PATENT DOCUMENTS

| | | | | |
|---|---|---|---|---|
| 5,907,253 | A * | 5/1999 | Davis | H03L 7/081 327/156 |
| 8,188,776 | B2 * | 5/2012 | Kumagai | H03L 7/183 327/156 |
| 9,000,858 | B2 * | 4/2015 | Sun | H03C 3/0941 332/119 |
| 9,094,184 | B2 * | 7/2015 | Staszewski | H03C 3/0966 |
| 9,547,333 | B2 * | 1/2017 | Breuer | G06F 1/12 |

* cited by examiner

*Primary Examiner* — Eva Y Puente
(74) *Attorney, Agent, or Firm* — Lee & Hayes, P.C.

(57) ABSTRACT

A measurement system may measure a fractional time delay of transmission of a signal across a medium, such as a cable. The system may use a first clock to assist in creating and injecting an injected sequence (signal) into the medium. A second, slower clock may be used for sampling the sequence after transmission of the sequence through the medium. This causes a time Vernier scale effect that results in a sampled sequence that has a one-step skip for each instances of the sequence, where the sequence has N elements in the sequence. The location of the skip within the sequence will depend on the magnitude of the delay measured as a fraction of a clock period with a resolution of N. To measure this delay, a modified version of a pseudo-random sequence generator, capable of skipping one step, is used to determine the output.

20 Claims, 7 Drawing Sheets

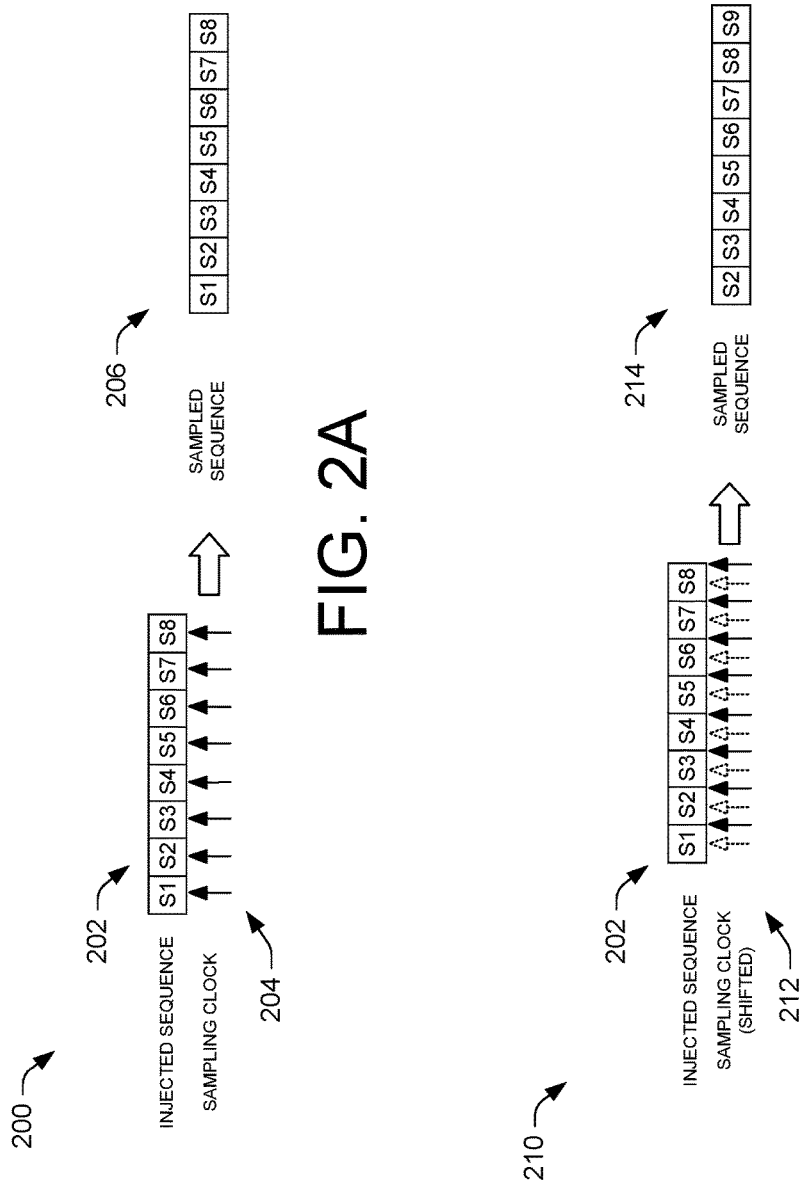

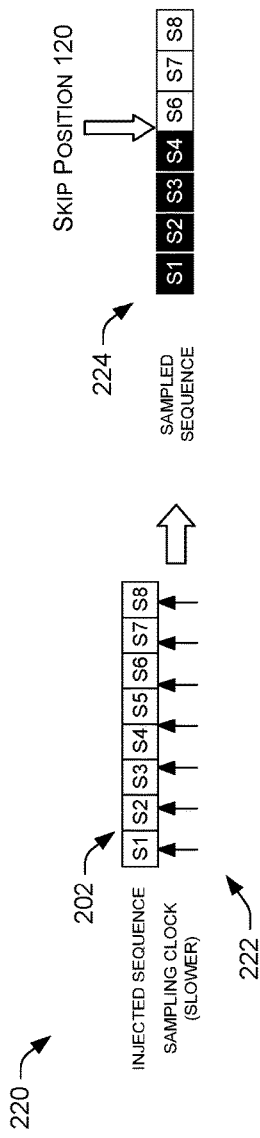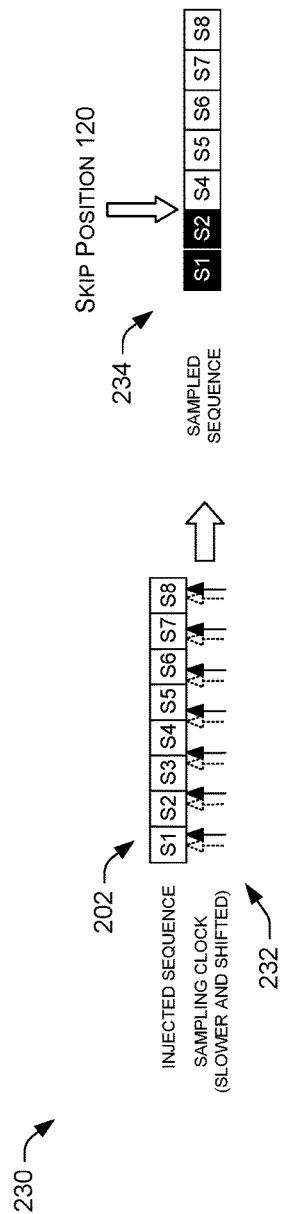

PRECISE TRANSMISSION MEDIUM DELAY MEASUREMENT

BACKGROUND

A typical technique to measure the delay of a transmission medium is to inject a sequence into a medium (e.g., a cable) and interfere the output of the transmission medium with the same sequence delayed by an integer number of clock cycles. The resulting interference will have complete correlation (maximum/minimum interference cumulative value) when the number of cycles of delay corresponds with the delay of the medium. The inherent limitation of this technique is that the measurement resolution is one integer clock cycle. To increase resolution, and thus more accurately measure the delay, more precise equipment must be used, which may be cost prohibitive.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

FIGS. 2A-D are schematic diagrams of time sequence data, which is manipulated to create a time Vernier effect to increase accuracy of a measurement.

DETAILED DESCRIPTION

Figure 1:
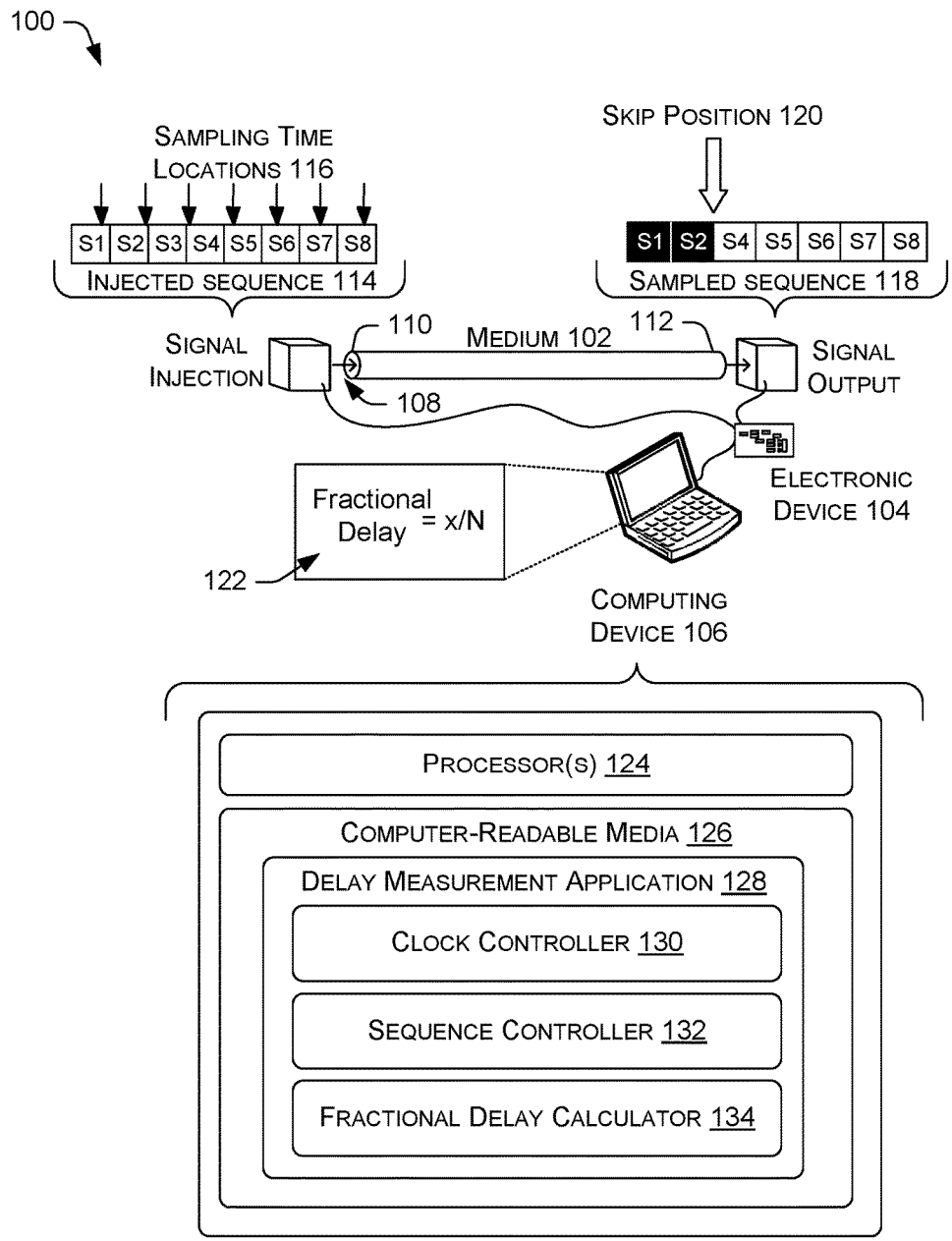
FIG. 1 is a schematic diagram of an illustrative environment to implement precise transmission medium delay measurement.

This disclosure is directed to techniques, apparatuses, and systems to measure a fractional time delay of transmission of a signal across a medium, such as a cable or other medium. The disclosure describes creation of a time Vernier scale effect that can determine a fractional delay using some equipment that, when used in a conventional manner, cannot determine the fractional delay. For example, a 1 kHz clock could typically measure a delay to $1/1,000$ seconds, (0.001 seconds), but could not typically be used to measure a delay to $1/10,000$ seconds (0.0001 seconds) or even up to 0.000001 seconds (using division of $1/1000$ a millisecond). To measure at the latter number of significant digits, a 10 kHz clock would be used when employing conventional techniques. However, as discussed below, using the techniques, apparatuses, and systems described below, a 1 kHz clock can measure a fractional time delay of $1/10,000$ seconds. Of course, clocks with much finer resolution (e.g., GHz, etc.) may be used in measurement of the delay, which may determine fractional delays in the order of a nanosecond, for example.

Techniques, apparatuses, and systems may use a first clock for signal injection that is different than a second clock for sampling an output that passes through a medium. The second clock may use a (N−1)/N ratio, where N is a predetermined number of divisions of time used in the fractional delay (e.g., 1/N). This causes a time Vernier scale effect that results in a sampled sequence that has a one-step skip for each instances of the sequence, where the sequence has a length N (e.g., N elements in the sequence). The location of the skip within the sequence will depend on the magnitude of the delay measured as a fraction of a clock period with a resolution of N. To measure this delay, a modified version of a pseudo-random sequence generator, capable of skipping one step, is used to determine the output.

In various embodiments, an general error value or confidence associated with the fractional delay may be determined based on specifications of test equipment used to determine the fractional delay. The error may be a confidence interval. The error may be based on a precision of the first clock, a precision of the second clock, and/or a precision of other components used in the techniques, apparatuses, and/or systems.

An example hardware configuration may include a first clock and a linear feedback shift register (LFSR) to generate a pseudo-random sequence injected, based on the first clock, into a medium under test. The medium may be a cable or any other medium used to transmit a signal. The LFSR may be a 5-bit LFSR; however, other number of bits may be used depending on design considerations. A phase lock loop (PLL) may be in communication with the first clock. The PLL may operate as a second clock that is slower than the first clock. Thus, the interval between counts in the second clock may be longer (spaced out more) than with the first clock. The PLL may be used to sample the pseudo-random sequence that passes through the medium to create a sampled pseudo-random sequence. A predetermined quantity (N) of skipping LFSRs may be in communication with the PLL to each generate different known skipping sequences. Each consecutive known skip sequence may include a 1/N difference. For example, if N=1000, the difference may be $1/1000$, and the skipping sequences may include $1/1000, 2/1000, 3/1000, \ldots 1000/1000$. In practice, N may be $2^{10}=1024$, which approximates 1000. In some embodiments, a plurality of XOR gates may be used to compare the sampled pseudo-random sequence to each of the different known skipping sequences to output a known skip position (x) based on correlation of a known skipping sequence. The known skip position may indicate a fractional delay associated with the medium, where the fractional delay is x/N.

An example process may include injecting, using a first clock, a pseudo-random sequence into a medium under test. The pseudo-random sequence may be sampled after passing through the medium with a second clock that is slower than the first clock to create a sampled pseudo-random sequence. A predetermined number (N) of known skipping pseudo-random sequences may be generated. Each consecutive known skip pseudo-random sequence may include a 1/N difference. The sampled pseudo-random sequence may be compared to the predetermined number N of skipping pseudo-random sequences to find a correlated known skipping pseudo-random sequence with a known position (x) within the known skipping pseudo-random sequences. Finally, the techniques may determine a fractional delay x/N associated with the medium based on a position of the correlated known skipping pseudo-random sequence.

The techniques and systems described herein may be implemented in a number of ways. Example implementations are provided below with reference to the following figures.

FIG. 1 is a schematic diagram of an illustrative environment 100 to implement precise transmission medium delay measurement. The illustration in FIG. 1 is not drawn to scale and shows certain elements larger than others for sake of description. The environment 100 may include a medium 102 to be tested to determine a time delay for a signal to be traverse the medium. For example, the medium may be a cable or other device, material, or mechanism to transmit a signal from a first location to a second location.

To measure the delay, an electronic device 104 and/or computing device 106 may be to inject a signal 108 into a first end 110 of the medium 102 and determine a time of receipt of the signal 108 output at a second end 112 of the medium 102.

Figure 3A:
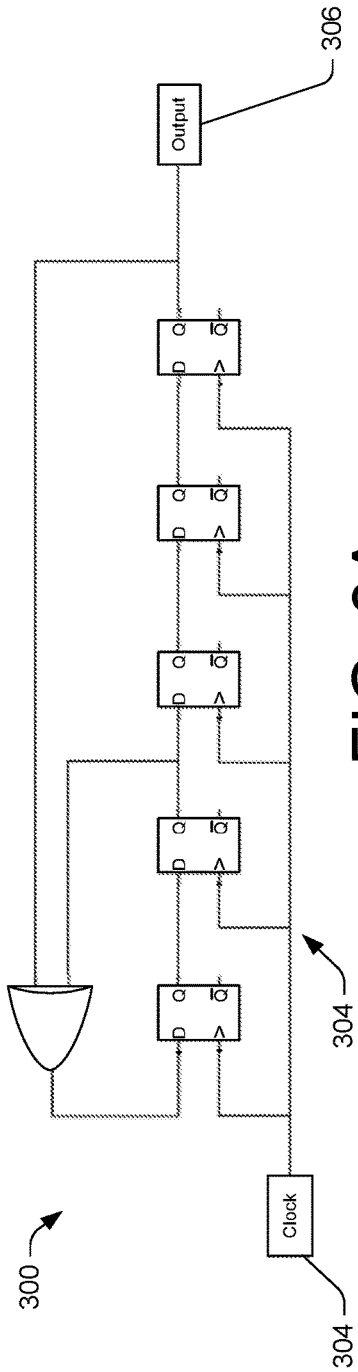
FIGS. 3A and 3B are circuit diagrams of illustrative linear feedback shift registers (LFSRs).
Figure 3B:
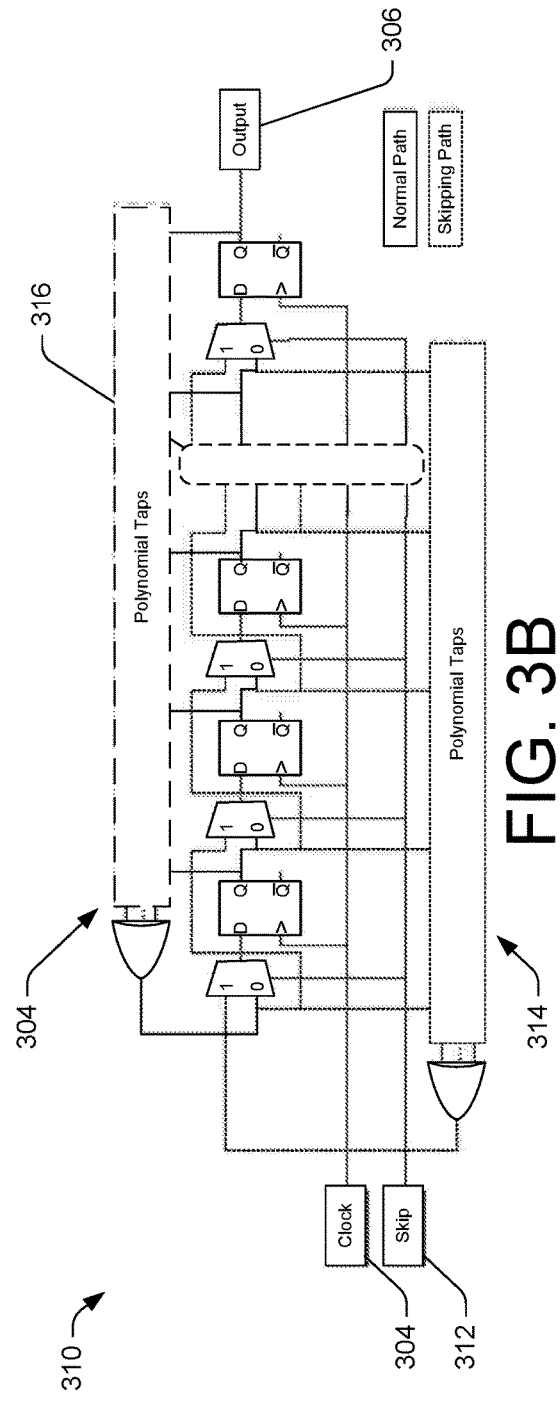

The signal 108 may be an injected sequence 114, which may be a pseudo-random sequence. The sequence may be generated based on an output of a first clock. The first clock may be provided by the electronic device 104. A second clock, which may be based on the output of the first clock (e.g. synchronized with the first clock), may be used to sample the injected sequence. The second clock may operate slower than the first clock, and thus the second clock may have longer intervals between time elements than the first clock. The second clock may sample the injected sequence at sampling time locations 116 after the sequence passes through the medium 102, and may create a sampled sequence 118. Since the second clock runs slower than the first clock, an element of the sequence will be skipped and omitted from the sampled sequence. As shown in FIG. 1, this skipped element is "S3", which is indicated as a skip position 120. The location of the skip position indicates a fractional delay 122, which may be expressed at x/N, where x is associated with the location of the skip position within the sampled sequence 118. FIGS. 2A-2D and associated description provide more information about the sampling time locations. FIGS. 3A and 3B and associated description provide more information about the sequences, and FIGS. 4 and 5 and associated description provide more information about the measurement system and determination of the location of the skip position, such as by use of a plurality of XOR (exclusive OR) gates.

In some embodiments, at least some of the operations may be controlled by the computing device 106, possibly via communication with the electronic device 104. Illustrative components of the electronic device 104 are described below with reference to FIGS. 3A, 3B, 4, and 5. The computing device 106 may include one or more processors 124 and one or more computer readable media 126 that stores various modules, applications, programs, or other data. The computer-readable media 126 may include instructions that, when executed by the one or more processors 124, cause the processors to perform the operations described herein.

Embodiments may be provided as a computer program product including a non-transitory machine-readable storage medium having stored thereon instructions (in compressed or uncompressed form) that may be used to program a computer (or other electronic device) to perform processes or methods described herein. The machine-readable storage medium may include, but is not limited to, hard drives, floppy diskettes, optical disks, CD-ROMs, DVDs, read-only memories (ROMs), random access memories (RAMs), EPROMs, EEPROMs, flash memory, magnetic or optical cards, solid-state memory devices, or other types of media/machine-readable medium suitable for storing electronic instructions. Further, embodiments may also be provided as a computer program product including a transitory machine-readable signal (in compressed or uncompressed form). Examples of machine-readable signals, whether modulated using a carrier or not, include, but are not limited to, signals that a computer system or machine hosting or running a computer program can be configured to access, including signals downloaded through the Internet or other networks. For example, distribution of software may be by an Internet download.

In some embodiments, the computer-readable media 126 may store a delay measurement application 128, which may include a clock controller 130, a sequence controller 132, and a fractional delay calculator 134, among other possible components. The clock controller 130 may control the first clock and/or the second clock. In some embodiments, the clock controller 130 may generate the first clock and/or the second clock. The clock controller 130 may synchronize the second clock with the first clock. The clock controller 130 may slow the second clock to create the sampling frequency as discussed above that results in a skipped element. In various embodiments, the clock controller 130 may control one or more clocks on the electronic device 104, possibly including a phase lock loop (PLL).

The sequence controller 132 may generate sequences for injection into the medium 102. In some embodiments, the sequence controller 132 may cause a sequence to be created by the electronic device 104, such as by a linear feedback shift register (LFSR). In various embodiments, the sequence controller 132 may determine and/or initiate creation of skip sequences, which may be created with a known skip location in the sequence. The skip sequences may be created by different LFSRs. For example, an element of the sequence may be omitted in each sequence at a known position, which may be used for comparison with the sampled sequence 118 to determine a location of the skip position 120.

The fractional delay calculator 134 may determine and/or calculate the fractional delay 122. The fractional delay calculator 134 may determine the fractional delay 122 based on a position x associated with the skip position 120. The fractional delay 122 may be expressed as x/N, where N is a predetermined number of elements in the injected sequence 114.

FIGS. 2A-D are schematic diagrams of time sequence data, which is manipulated to create a time Vernier effect to increase accuracy of a measurement.

FIG. 2A shows example sequences 200 that include an injected sequence 202. The injected sequence 202 may be a pseudo-random sequence that may be generated by a LFSR of the electronic device 104 and/or the sequence controller 132 of the computing device 106 shown in FIG. 1. As an example, the sequence may include eight different elements, labeled for explanation purposes as S1, S2, S3, S4, S5, S6, S7, and S8. The elements may be injected in accordance with a first clock.

For example, using a 1 kHz clock (although clocks with other resolution frequencies may be used), each element may be spaced apart 0.001 seconds. The injected sequence 202 may be injected into the medium and sampled using a second clock. For explanation purposes, a traditional sampling clock 204 creates sampling shown in FIG. 2A, which uses a same interval as the first clock and thus corresponds to each element in the sequence. A resulting sampled sequence 206 will then include each element from the injected sequence, and thus S1, S2, S3, S4, S5, S6, S7, and S8. In this case, no skipping occurs because the first clock and the second clock (sampling clock) are synchronized and use the same time interval (e.g., 0.001 seconds). Modifications to this configuration are made to create a time Vernier effect, as discussed below.

FIG. 2B shows example sequences 210 that include the injected sequence 202, again with the example elements S1, S2, S3, S4, S5, S6, S7, and S8. The elements may be injected in accordance with the first clock. For example, using a 1 kHz clock, each element may be spaced apart 0.001 seconds. The injected sequence 202 may be injected into the medium and sampled using a second clock. For explanation purposes, a shifted traditional sampling clock 212 creates sampling shown in FIG. 2B, which uses a same interval as the first clock, but is shifted (to the right as shown in FIG. 2B) and thus corresponds to each element in the sequence. In FIG. 2B, the dashed arrows represent a non-shifted position which corresponds to the sampling shown in FIG. 2A. Returning to FIG. 2B, a resulting sampled sequence 214 will then include each element from the injected sequence, and thus S2, S3, S4, S5, S6, S7, S8 and S9, where the shift used in the sampling causes the sampled sequence 214 to omit S1. In this case, no other skipping occurs because the first clock and the second clock (sampling clock) are synchronized and use the same time interval (e.g., 0.001 seconds). Additional modifications to this configuration are made to create a time Vernier effect, as discussed below.

FIG. 2C shows example sequences 220 that include the injected sequence 202, again with the example elements S1, S2, S3, S4, S5, S6, S7, and S8. The elements may be injected in accordance with the first clock. For example, using a 1 kHz clock, each element may be spaced apart 0.001 seconds. The injected sequence 202 may be injected into the medium and sampled using a second clock. For explanation purposes, a slowed sampling clock 222 creates sampling shown in FIG. 2C, which uses a longer interval than the first clock, such as 0.0011 seconds, however, other intervals may be used. For example, the second clock may cause sampling at (N−1)/N, with N being the sequence length. Because the second clock is slower than the first, a resulting sampled sequence 224 will omit or bypass sampling of an element in the sequence. As an example, the sampled sequence may omit element "S5", and only include S1, S2, S3, S4, S6, S7, and S8. The skip position 120 is associated with the element S5. This information creates a time Vernier effect, which can be used to determine a fractional delay. Additional modifications to this configuration are made to shift the sampling to implement the time Vernier effect, as discussed below.

FIG. 2D shows example sequences 230 that include the injected sequence 202, again with the example elements S1, S2, S3, S4, S5, S6, S7, and S8. The elements may be injected in accordance with the first clock. For example, using a 1 kHz clock, each element may be spaced apart 0.001 seconds. The injected sequence 202 may be injected into the medium and sampled using a second clock. A slowed and shifted sampling clock 232 creates sampling shown in FIG. 2D, which uses a longer interval than the first clock, such as 0.0011 seconds, however, other intervals may be used. For example, the second clock may cause sampling at (N−1)/N, with N being the sequence length. Here, the second clock is slowed and shifted with respect to the clock shown in FIG. 2C to create the sampling clock 232 with sampling shown in FIG. 2D, which uses a longer interval than the first clock, and is shifted (to the right in FIG. 2D). In FIG. 2D, the dashed arrows represent a non-shifted position which corresponds to the sampling shown in FIG. 2C. Returning to FIG. 2D, because the second clock is slower than the first, and shifted, a resulting sampled sequence 234 will omit or bypass sampling of an element in the sequence. As an example, the sampled sequence may omit element "S3", and only include S1, S2, S4, S5, S6, S7, and S8. The skip position 120 is associated with the element S3. This information creates a time Vernier effect, which can be used to determine a fractional delay. The element S3 is associated with a known position x. Thus, the fractional delay is x/N.

FIG. 3A is a circuit diagram of an illustrative linear feedback shift register (LFSR) 300 usable to create the injected sequence discussed above. The LFSR 300 may be a five-bit LFSR that creates a pseudo-random sequence as the injected sequence. However, other numbers of bits may be used depending on design requirements and required precision in the fractional delay measurement. For example, the LSFR may include a ten-bit LFSR, which may create approximately 1000 elements in a pseudo-random sequence, and thus a 1/1000 division of a time metric. The LFSR 300 may include the first clock 302, a LFSR circuit 304, and an output 306, which may output the pseudo-random sequence for injection into the medium 102 shown in FIG. 1. As described below, the LFSR 300 may be modified to create known skipping sequences.

FIG. 3B is a circuit diagram of an illustrative skipping linear feedback shift register (LFSR) 310 usable to create known skipping sequences. The skipping LFSR may use a skip input 312 to artificially create known skipping sequences using skipping SFSR circuit(s) 314. The skipping SFSR circuit(s) 314 are shown in FIG. 3B with a void 316, which illustrates that different numbers of bits may be used to form the LFSR 304 and the skipping SFSR(s) 314.

It is possible to artificially generate the same "skipping" sequences which result from the timing differences described above, by modifying the generation circuit so that on any cycle it can advance the equivalent to two cycles instead of one. The FIG. 3B shows a typical pseudo-random sequence generator; in this case LFSR 304. Reset circuitry necessary to guarantee initialization at a valid state in the sequence is not shown.

The LFSR topology implements a XOR polynomial on specific taps of the shift register, and feeds the resulting operation on the beginning of the shift register. The longest pseudo-random sequence LFSR's generate (when the appropriate polynomial is selected) is $(2^n)-1$ steps, with n being the number of register bits. LFSR's like the LFSR 304 can be modified in a generic manner so that it can skip steps by one count every cycle a control signal is set activated to create the skipping LFSRs 314.

Figure 4:
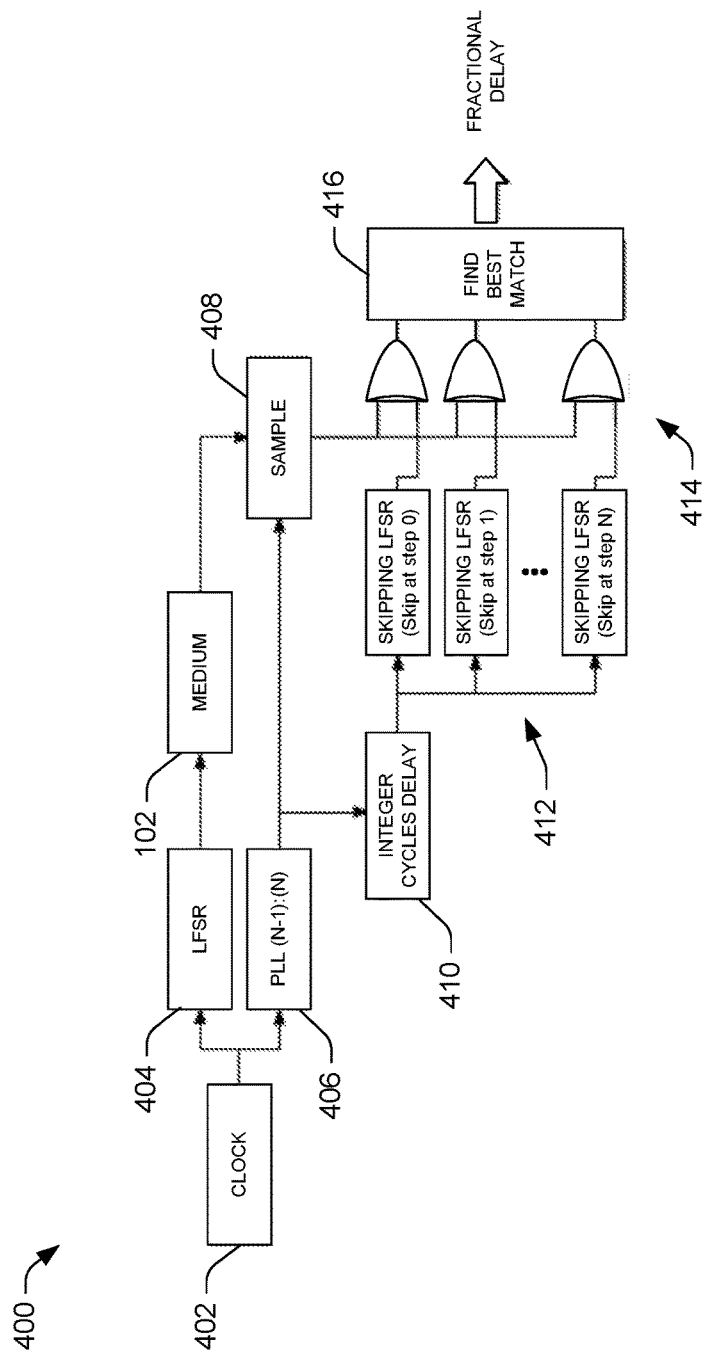
FIG. 4 is a schematic diagram of a delay measurement system that includes a LFSR and a plurality of skipping LFSR configured to determine a fractional delay.

FIG. 4 is a schematic diagram of a delay measurement system 400. The delay measurement system 400 may be implemented on the electronic device 104, the computing device 106, or using a combination of the electronic device 104 and the computing device 106.

The delay measurement system may include a first clock 402 that operates at a known precision and frequency. The first clock 402 may output information to an LFSR 404, which may be the same as the LFSR 304, such as a ten-bit LFSR that creates a pseudo-random sequence to be inputted into the medium 102.

Meanwhile, the first clock 402 may output information to a second clock, which may be implanted as a phase lock loop (PLL) 406. The PLL 406 may implement time synchronized with the first clock 402, but set as (N−1):(N), which may operate as a slower clock that ultimately creates a skip when sampling the pseudo-random sequence created by the LFSR and sampled at a sampler 408. As discussed above, the PLL may be used to sample the pseudo-random sequence after passage through the medium 102 to create a sampled pseudo-random sequence which include one skipped element.

The delay measurement system 400 may include an integer cycles delay, which may account for an integer delay (y) of transmission of the sequence through the medium. Thus the actual transmission delay would be the integer delay y plus the fractional delay x/N. The integer cycles delay may determine the value y using various techniques, such as using a traditional configuration to determine delay where the first and second clock use the same frequency and are synchronized with the same interval, by random tests, by incremental changes in delay to determine the integer delay y, and so forth.

The delay measurement system 400 may include different known skipping LFSRs 412. The known skipping LFSRs 412 may be generated as discussed above with respect to FIG. 3B, such that each known skipping LFSRs skips a different element, and has a known position of that element in relation to the other elements in the sequence. The outputs (known skipping sequences) of the known skipping LFSRs 412 may each pass through a corresponding XOR gate of a plurality of XOR gates 414 to determine a match between the sampled pseudo-random sequence and one of the known skipping LFSRs 412. The sampled pseudo-random sequence may be compared (by interference) with known skipping sequences. Whichever skipping sequence interference has a largest correlation corresponds with the delay of the medium, with a resolution of 1/N of the clock period.

A matching component 416 may determine a location x associated with the matched known skipping LFSR that corresponds to the sampled pseudo-random sequence (i.e., has the same element missing or skipped in both). The location x may be used to determine the fractional delay as x/N, where N is a number of skipping known pseudo-random sequences.

An example hardware configuration may include a first clock and a linear feedback shift register (LFSR) to generate a pseudo-random sequence injected, based on the first clock, into a medium under test. The medium may be a cable or any other medium used to transmit a signal. The LFSR may be a 5-bit LFSR; however, other number of bits may be used depending on design considerations. A phase lock loop (PLL) may be in communication with the first clock. The PLL may operate as a second clock that is slower than the first clock. Thus, the interval between counts in the second clock may be longer (spaced out more) than with the first clock. The PLL may be used to sample the pseudo-random sequence that passes through the medium to create a sampled pseudo-random sequence. A predetermined quantity (N) of skipping LFSRs may be in communication with the PLL to each generate different known skipping sequences. Each consecutive known skip sequence may include a 1/N difference. For example, if N=1000, the difference may be 1/1000, and the skipping sequences may include 1/1000, 2/1000, 3/1000, . . . 1000/1000. In some embodiments, a plurality of XOR gates may be used to compare the sampled pseudo-random sequence to each of the different known skipping sequences to output a known skip position (x) based on correlation of a known skipping sequence. The known skip position may indicate a fractional delay associated with the medium, where the fractional delay is x/N.

In some embodiments, the example hardware configuration may include an integer cycles delay component to increase an output of the PLL by an integer delay (y) as an input to the skipping LFSRs. The total delay may be calculated as the integer delay y plus the fractional delay x/N.

In various embodiments, the LFSR includes a ten-bit LFSR, and thus the skipping LFSRs may be configured in a same way, but including the intentional skip position. However, other bit values may be used depending on design requirements of the measurement system.

As discussed above, the PLL may operate as a slower clock than the first clock, and may operate at (N−1):(N) to include a longer interval between each unit measure than the first clock.

Other design considerations may exist. A highly stable clock source with small jitter over the measuring sequence duration may prove beneficial to reduce error in the determined fractional delay. A highly stable PLL derived clock, also having a small jitter requirement, may be similarly helpful, and having large multiplier divider ratios (999:1000, typically). In addition, some errors may be due to a sampling metastability window (e.g., sample and hold window of the sampling register) as the sampling clock edge nears the transition edges of the signal out of the medium.

Figure 5:
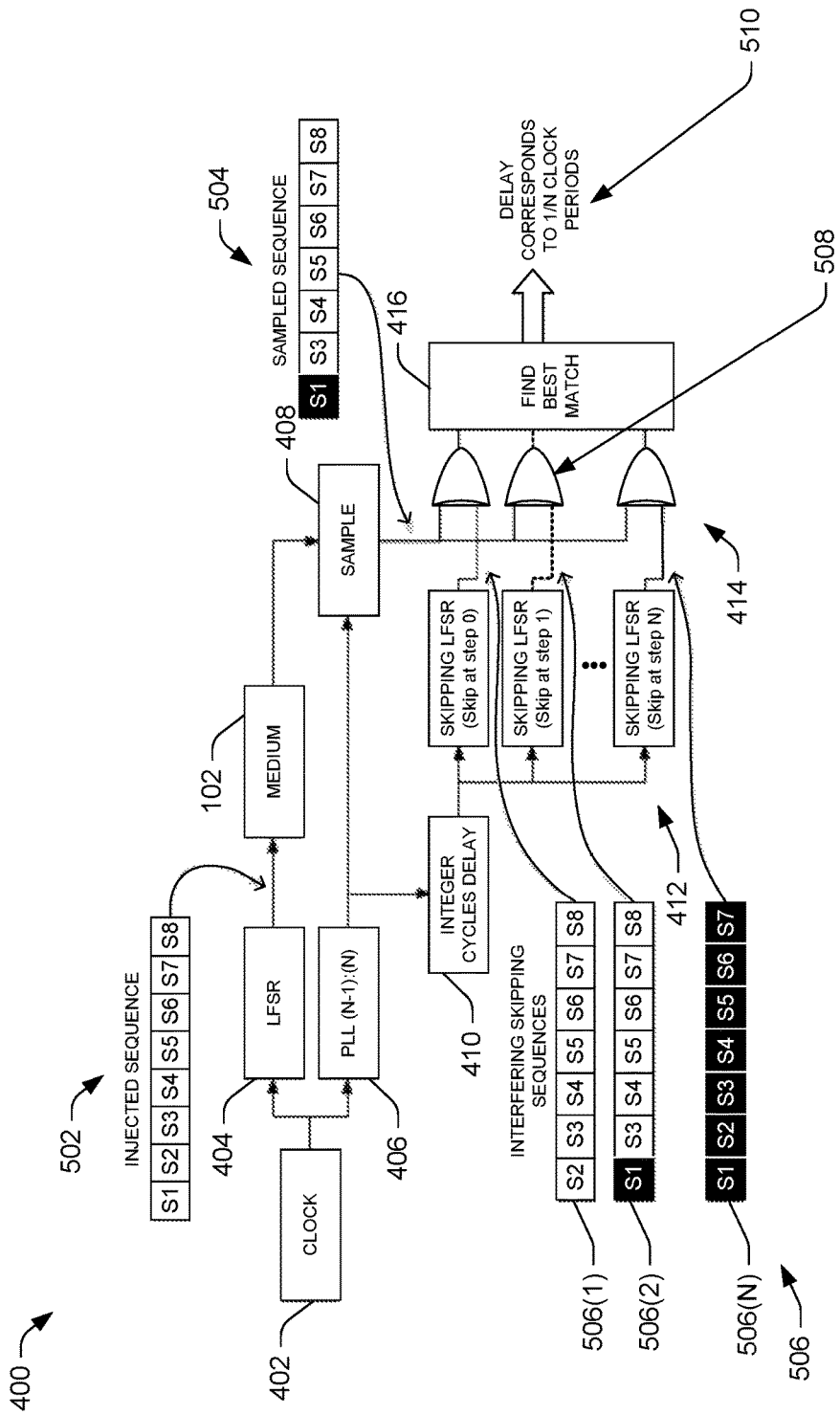
FIG. 5 is a schematic diagram showing the system of FIG. 4 with sample time sequence data.

FIG. 5 is a schematic diagram showing the measurement system 400 of FIG. 4 with sample time sequence data. An injected sequence 502 may be a pseudo-random sequence that may be generated by the LFSR 404 based on output of the first clock 402. As an example, the pseudo-random sequence may include eight different elements, labeled for explanation purposes as S1, S2, S3, S4, S5, S6, S7, and S8.

After sampling at intervals determined by the PLL 406, a sampled pseudo-random sequence 504 may be determined. The sampled pseudo-random sequence may include a skipped element due to the PLL 406 operating as a slower clock than the first clock 402. As an example, the sampled pseudo-random sequence may be S1, S3, S4, S5, S6, S7, and S8 where the element "S2" is skipped.

The known skipping LFSRs 412 may create different known skipping sequences 506. For example, a first known skipping sequence 506(1) may include S2, S3, S4, S5, S6, S7, and S8 where element "S1" is skipped; a second known skipping sequence 506(1) may include S1, S3, S4, S5, S6, S7, and S8 where element "S2" is skipped; and a last known skipping sequence 506(N) may include S1, S2, S3, S4, S5, S6, and S7 where element "S8" is skipped.

The known skipping sequences 506 may be compared to the sampled pseudo-random sequence 502 to determine a match (via the XOR gates 414 and/or the matching component 416. A match may be determined via the XOR gate 508 in this example, since the known skipping sequence 506(2) matches the sampled pseudo-random sequence 504. The known skipping sequence 506(2) may have a known location of x=1. Thus, the fractional delay 510 may be 1/N clock periods.

Figure 6:
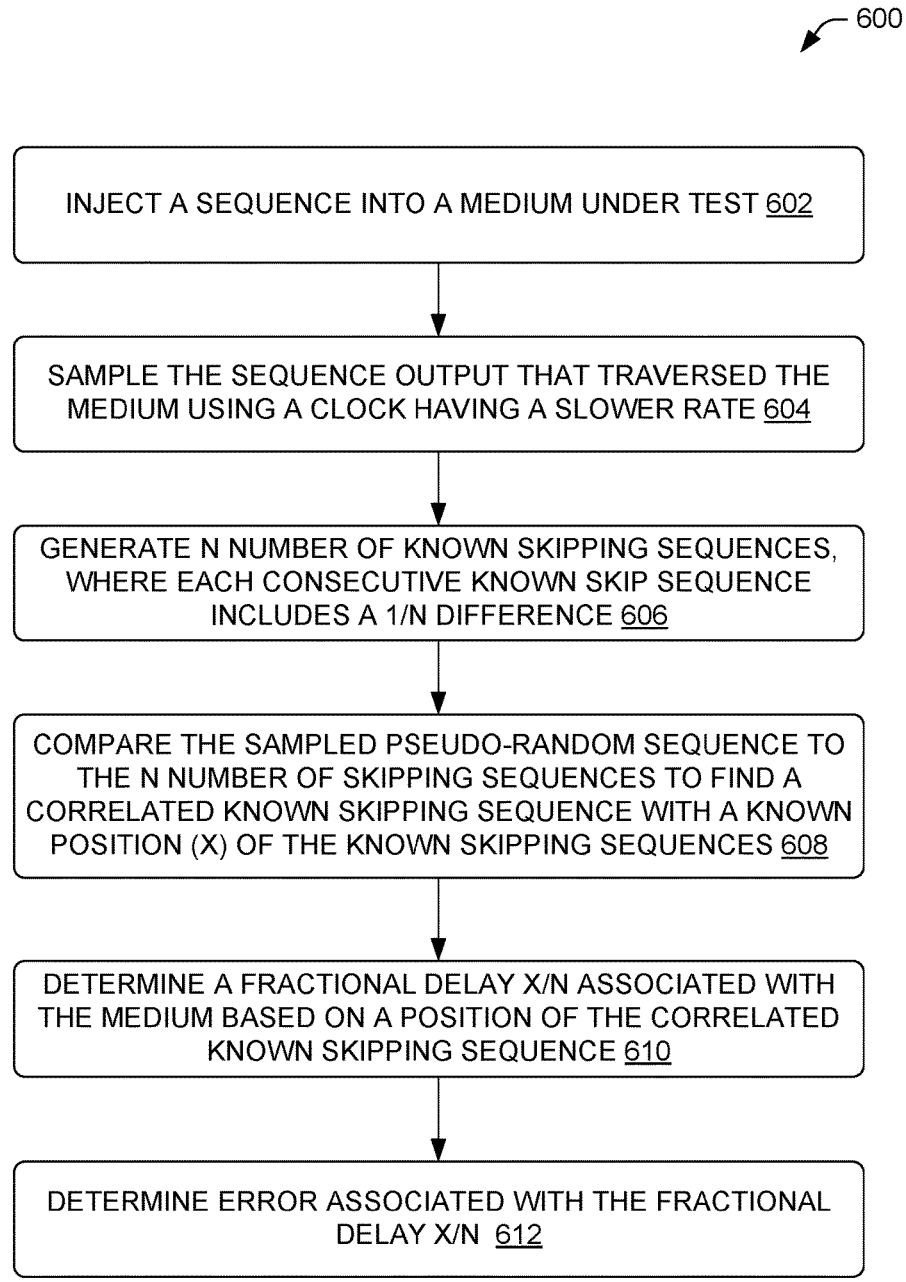
FIG. 6 is a flow diagram of an illustrative process to measure a fractional delay of a transmission of a sequence through a test medium.

FIG. 6 is a flow diagram of an illustrative process 600 to measure a fractional delay of a transmission of a sequence through a test medium. The process 600 is illustrated as a collection of blocks in a logical flow graph, which represent a sequence of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the process.

The process 600 is described with reference to the preceding figures. Of course, the process 600 may be performed in other similar and/or different environments, possibly using at least some electrical components, some software components, or a combination of both.

At 602, the measurement system may inject, using a first clock, a sequence into a medium under test. The sequence may be a pseudo-random sequence created by a LFSR. In some embodiments, the LFSR may be a ten-bit LFSR.

At 604, the measurement system may sample the sequence with a second clock that is slower than the first clock to create a sampled sequence. The second clock may be a PLL which may operate at (N−1):(N) to include a longer interval between each unit measure than the first clock. The PLL may have a multiplier divider ratio of at least 999:1000. In some embodiments, N may be at least 1000 (e.g., ten bits or 2^10). In various embodiments, N may be other numbers, such as 256, 512, and so forth.

At 606, the measurement system may generate a predetermined number (N) of known skipping sequences. Each consecutive known skip sequence includes a 1/N difference.

At 608, the measurement system may compare the sampled sequence to the predetermined number N of skipping sequences to find a correlated known skipping sequence with a known position (x) within the known skipping sequences.

At 610, the measurement system may determine a fractional delay x/N associated with the medium based on a position of the correlated known skipping sequence. The fractional delay may be added to an integer delay to determine a total delay with greater precision than conventional measurement systems using similar equipment, but not employing the disclosed time Vernier effect.

At 612, the measurement system may determine an error associated with the fractional delay. The error may be based at least in part on precision of at least one of the first clock or the second clock. In some embodiments, the error may be determined as a confidence interval. The error may represent an accuracy of the fractional delay, which may be expressed using a confidence interval, such as 95% or other confidence intervals.

In various embodiments, the measurement system may determine an integer cycle delay (y). The total delay of traversal of a signal (e.g., an element of the sequence) across the medium includes the integer cycle delay (y) plus the fractional delay x/N. The integer cycle delay may be performed using an iterative sampling, ransom sampling, or using other techniques.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. An electronic device, comprising:
    a first clock;
    a linear feedback shift register (LFSR) to generate a pseudo-random sequence injected, based on the first clock, into a medium under test;
    a phase lock loop (PLL) in communication with the first clock, the PLL to operate as a second clock that is slower than the first clock, the PLL used to sample the pseudo-random sequence that passes through the medium to create a sampled pseudo-random sequence;
    a predetermined number (N) of known skipping LFSRs in communication with the PLL, where each consecutive known skipping sequence includes a 1/N difference from a next skipping sequence; and
    a plurality of XOR gates to compare the sampled pseudo-random sequence to each of the known skipping sequences to output a known skip position (x) based on correlation of a known skipping sequence, the known skip position x indicating a fractional delay x/N associated with the medium.

2. The electronic device as recited in claim 1, further comprising an integer cycles delay component to increase an output of the PLL by an integer delay as an input to the known skipping LFSRs.

3. The electronic device as recited in claim 1, wherein the PLL operates at (N−1):(N) to include a longer interval between each unit measure than the first clock.

4. A method performed by an electronic device, the method comprising:
    injecting, using a first clock, a sequence into a medium under test;
    sampling the sequence with a second clock that is slower than the first clock to create a sampled sequence;
    generating a predetermined number (N) of known skipping sequences that each skip a different element in the sequence;
    comparing the sampled sequence to the known skipping sequences to find a correlated known skipping sequence with a known skip position (x) within the known skipping sequences; and
    determining a fractional delay x/N associated with the medium based on the known skip position x of the correlated known skipping sequence.

5. The method as recited in claim 4, further comprising determining an error associated with the fractional delay, the error based at least in part on precision of at least one of the first clock or the second clock.

6. The method as recited in claim 5, wherein the error is a confidence interval.

7. The method as recited in claim 4, further comprising determining an integer cycle delay (y), wherein the total delay of traversal of the sequence across the medium includes the integer cycle delay (y) plus the fractional delay x/N.

8. The method as recited in claim 7, wherein the determining the integer cycle delay is performed using an iterative sampling.

9. The method as recited in claim 4, wherein N is at least 1000.

10. The method as recited in claim 4, further comprising creating the sequence includes creating the sequence using a linear feedback shift register (LFSR).

11. The method as recited in claim 4, further comprising using a phase lock loop (PLL) as the second clock to sample the sequence.

12. The method as recited in claim 11, wherein the PLL operates at (N−1):(N) to include a longer interval between each unit measure than the first clock.

13. The method as recited in claim 11, wherein the PLL has a multiplier divider ratio of at least 999:1000.

14. The method as recited in claim 4, wherein the sequence includes a pseudo-random sequence.

15. A method comprising:
    injecting, using a first clock, a sequence into a medium under test;

sampling the sequence based on output of a phase lock loop (PLL) that operates as a second clock that is slower than the first clock to create a sampled sequence;

generating a predetermined number (N) of known skipping sequences that each skip a different element in the sequence;

comparing the sampled sequence to the known skipping sequences using a plurality of XOR gates to output a value associated with a known skip position (x) of a correlated known skipping sequence within the known skipping sequences; and outputting a fractional delay associated with the medium as x/N.

16. The method as recited in claim 15, further comprising determine an integer cycle delay (y), and wherein a total delay associated with the medium includes the integer cycle delay (y) plus the fractional delay x/N.

17. The method as recited in claim 15, further comprising creating the sequence using a linear feedback shift register (LFSR).

18. The method as recited in claim 15, wherein the PLL operates at (N−1):(N).

19. The electronic device as recited in claim 1, wherein N is at least 1000.

20. The method as recited in claim 15, wherein N is at least 1000.

* * * * *